(12) United States Patent
Granik

(10) Patent No.: US 8,464,185 B2
(45) Date of Patent: Jun. 11, 2013

(54) ELECTRON BEAM SIMULATION CORNER CORRECTION FOR OPTICAL LITHOGRAPHY

(75) Inventor: Yuri Granik, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 12/625,466

(22) Filed: Nov. 24, 2009

(65) Prior Publication Data

US 2010/0269086 A1 Oct. 21, 2010

Related U.S. Application Data

(60) Provisional application No. 61/117,286, filed on Nov. 24, 2008.

(51) Int. Cl.
*G06F 17/50* (2006.01)

(52) U.S. Cl.
USPC .................... 716/51; 716/50; 716/52; 716/53

(58) Field of Classification Search
USPC ......................................... 716/50, 51, 52, 53
See application file for complete search history.

(56) References Cited

U.S. PATENT DOCUMENTS

| | | | | |
|---|---|---|---|---|
| 2002/0188924 A1* | 12/2002 | Pierrat et al. | | 716/19 |
| 2003/0233630 A1* | 12/2003 | Sandstrom et al. | | 716/19 |
| 2005/0208392 A1* | 9/2005 | Yamamoto | | 430/5 |
| 2008/0003510 A1* | 1/2008 | Harazaki | | 430/5 |

* cited by examiner

*Primary Examiner* — Stacy Whitmore
*Assistant Examiner* — Mohammed Alam
(74) *Attorney, Agent, or Firm* — Plumsea Law Group, LLC

(57) ABSTRACT

Methods for approximating simulated contours are provided herein. With some implementations, a function that incorporates a Gaussian proximity kernel to approximate the electron beam exposure effects is used to simulate a printed image. Subsequently, one or more corners of the simulated printed image may be approximated by two or more straight edges. In various implementations, the number of straight edges used to approximate the corner as well as the orientation of the one or more straight edges is determined based upon the characteristics of the corner, such as, the corner having an obtuse angle larger than 135 degrees for example. With various implementations, two straight edges are used to approximate the corner, the orientation of the two straight edges being determined by a first point, a second point, and a shared corner point.

16 Claims, 8 Drawing Sheets

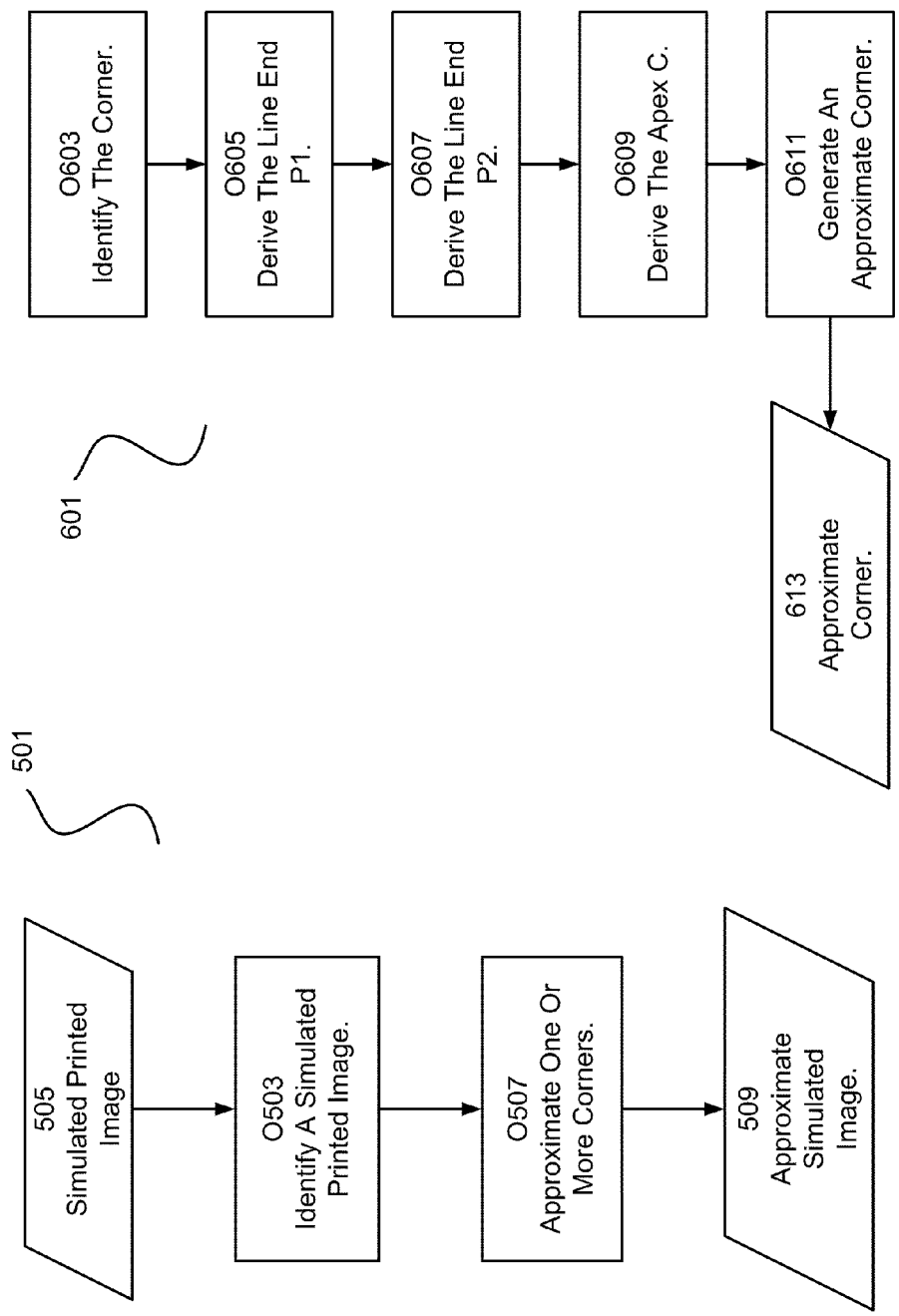

ELECTRON BEAM SIMULATION CORNER CORRECTION FOR OPTICAL LITHOGRAPHY

RELATED APPLICATIONS

This application claims priority under 35 U.S.C. §119(e) to U.S. Provisional Patent Application No. 61/117,286 entitled "Electron Beam Simulator," filed on Nov. 24, 2008, and naming Yuri Granik as inventor, which application is incorporated entirely herein by reference.

FIELD OF THE INVENTION

The invention relates to the field of integrated circuit design and manufacturing. More particularly, various implementations of the invention are applicable to simulating the proximity effects of electron beam exposure in optical lithography and correcting corner rounding resulting there from.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, a design may start at a high level of abstraction, by a designer creating a specification that describes particular desired functionality. This specification, typically implemented by a programming language, such as the C or C++ programming language for example, describes at a high level the desired behavior of the device. Designers will then often take this specification for the design and create a logical design, often implemented in a netlist, through a synthesis process. The logical design is often referred to as a "register transfer level" (RTL) description or register transfer level design.

A register transfer level design is often implemented by a hardware description language (HDL) such as Verilog, SystemVerilog, or Very High speed hardware description language (VHDL), and describes the operation of the device by defining the flow of signals or the transfer of data between various hardware components within the design. More particularly, a register transfer level design describes the interconnection and exchange of signals between hardware registers and the logical operations that are performed on those signals.

The design process includes another transformation, this time the register transfer level design is transformed into a gate level design. Gate level designs describe the actual physical components such as transistors, capacitors, and resistors as well as the interconnections between these physical components. Often, gate level designs are also implemented by a netlist, such as a mapped netlist. Lastly, the gate-level design is taken and another transformation is carried out. First by place and route tools that arrange the components described by the gate-level netlist and route connections between the arranged components; and second, by layout tools that generate a layout description having layout "shapes" or "patterns" that may then used to fabricate the electronic device, through for example, an optical lithographic process.

Integrated circuit layout descriptions can be provided in many different formats. The Graphic Data System II (GDSII) format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in integrated circuit layout designs that are employed to manufacture integrated circuits. Once the microcircuit device design is finalized, the layout portion of the design can be used by fabrication tools to manufacturer the device using a photolithographic process.

There are many variations of the fabrication processes used to manufacture a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. Various common techniques exist for increasing the fidelity of the optical lithographic process. For example, optical process correction (OPC), phase shift masks (PSM) or other resolution enhancement techniques (RET) are commonly employed to prepare a physical layout designs for manufacturing.

These various resolution enhancement techniques are commonly applied at different stages of device development.

Many of these techniques make adjustments to the layout design, or the mask, based upon simulations of the optical lithographic process. More particularly, the mask is typically adjusted in such a manner that a simulation of the printed layout based upon the adjusted mask more closely resembles the intended layout. Functions that account for the various component of the optical lithographic process exist. However, some of these functions, such as the function for simulating the proximity effects of electron beam exposure, create troublesome corner rounding.

SUMMARY OF THE INVENTION

The present invention provides methods and apparatuses for correcting corner rounding resulting from simulating the proximity effects of electron beam exposure in optical lithography. In various implementations, a printed layout pattern is simulated based upon an intended layout pattern and a function that approximates the printing process. With some implementations, the function incorporates a Gaussian proximity kernel to approximate the electron beam exposure effects. Subsequently, one or more corners of the simulated layout may be approximated by two or more straight edges. In various implementations, the number of straight edges used to approximate the corner as well as the orientation of the one or more straight edges is determined based upon the characteristics of the corner, such as, the corner having an obtuse angle larger than 135 degrees for example. With various implementations, two straight edges are used to approximate the corner, the orientation of the two straight edges being determined by a first point, a second point, and a shared corner point.

BRIEF DESCRIPTION OF THE DRAWINGS

The present invention will be described by way of illustrative embodiments shown in the accompanying drawings in which like references denote similar elements, and in which:

FIG. 5 illustrates a method of correcting corner rounding in optical lithographic simulation;

FIG. 6 illustrates a method of approximating a corner of a layout feature;

DETAILED DESCRIPTION OF ILLUSTRATIVE IMPLEMENTATIONS

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

Furthermore, in various implementations of the invention, a mathematical function may be employed to approximate a real world process. With some implementations, functions describing an optical lithographic process, or portion of an optical lithographic process is employed. Those of skill in the art will appreciate that these functions represent real world physical processes. Accordingly, simulations based upon these functions are a representation of the tangible results, should the process be carried out under the simulated conditions.

Some of the methods described herein can be implemented by software stored on a computer readable storage medium, or executed on a computer. Accordingly, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art may be omitted.

Illustrative Computing Environment

Figure 1:
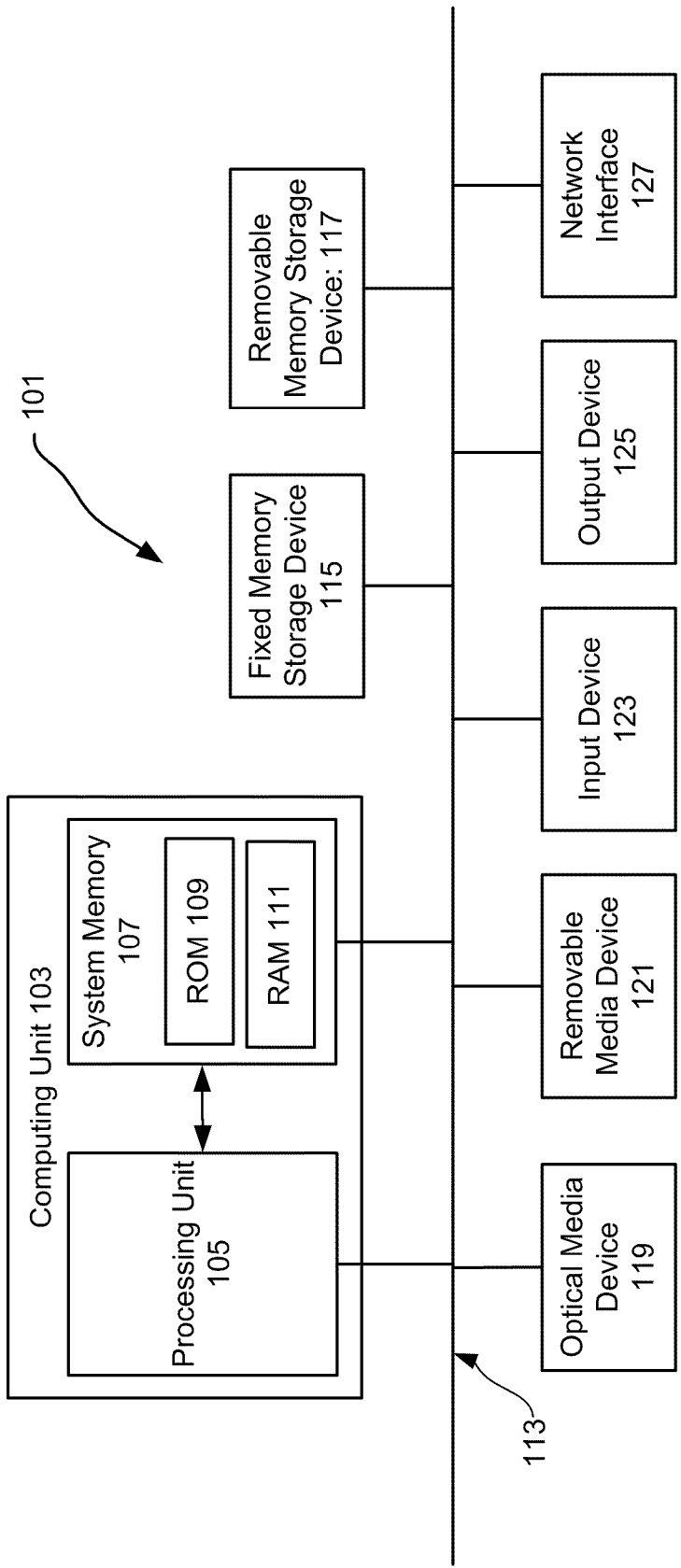
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Resolution Enhancement Process

In a photolithographic process, as explained above, electromagnetic radiation is transmitted through selectively transparent areas of a mask. The radiation passing through these transparent areas then irradiates desired portions of a photoresistive material on a layer of semiconductor substrate. The mask in turn is created from layout design data describing the geometric features that should be manufactured on the semiconductor substrate, by way of the photolithographic process, in order to create the desired circuit. For example, if a transistor should have a rectangular gate region, then the layout design data will include a rectangle defining that gate region. This rectangle in the layout design data is then implemented in a mask for "printing" the rectangular gate region onto the substrate.

Additionally, as discussed modern integrated circuit design and manufacturing flows typically include various layout design adjustment steps, occasionally referred to as pattern correction steps. In order to more fully understand the corner approximation techniques discussed herein, an illustrative shape based correction process is discussed. As stated, an optical lithographic process seeking to reproduce the rectangular mask feature 201 illustrated in FIG. 2, may only produce the image 203. As seen in this figure, the image 203 is substantially narrower in the corners (e.g., corner 205) than the ideal rectangular shape intended by the mask feature 201. Likewise, the image 203 may have areas (e.g., 207) that extend beyond the ideal rectangular shape intended by the mask feature 201. The intended shape or feature often is referred to as the target shape, or the target image. The image created by employing the mask in a photolithographic process (i.e the image 203) as stated above, may be referred to as the printed image.

To correct for these optical distortions, many circuit designers will attempt to modify the layout design data, producing modified mask features, to enhance the resolution of the images that will be produced by the modified mask during the photolithographic process. One resolution enhancement technique often employed by designers is called optical process correction (OPC) or optical proximity correction. In a typical optical proximity correction process, the edges of the geometric elements in the design are fragmented and adjusted in such a manner as to produce a printed image that more closely resembles the target image.

Figure 3:
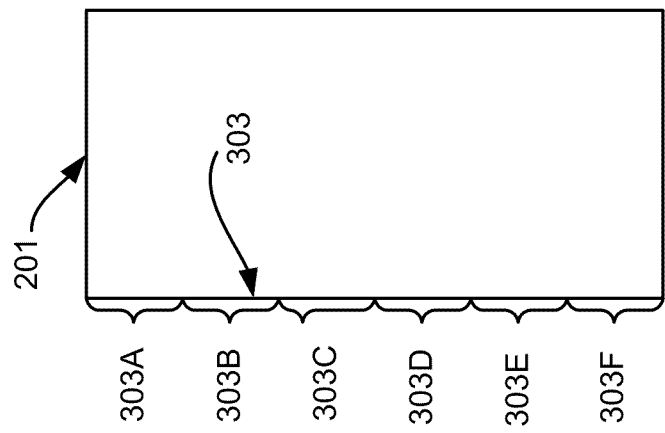
FIG. 3 illustrates the mask feature of FIG. 2, having an edge fragmented.
Figure 2:
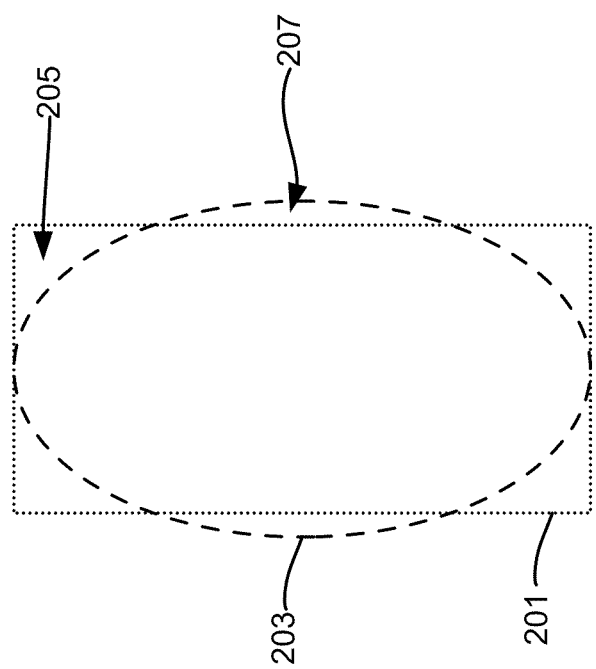
FIG. 2 illustrates a mask feature and corresponding printed layout pattern.
Figure 4B:
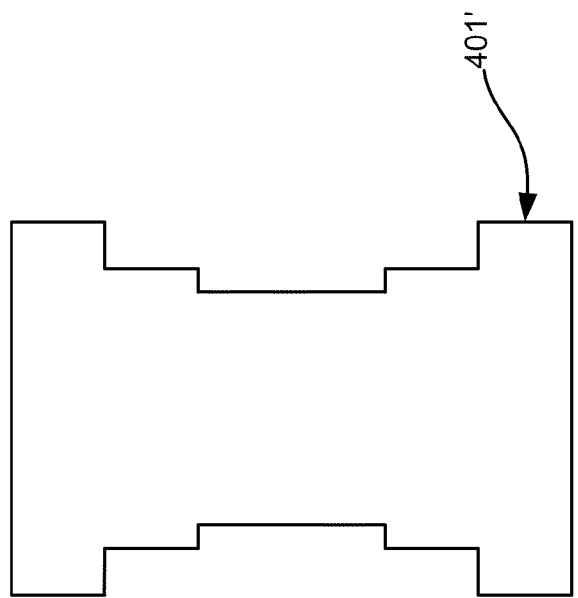
FIG. 4B illustrates a modified mask feature corresponding to the mask feature of FIG. 4B.
Figure 4A:
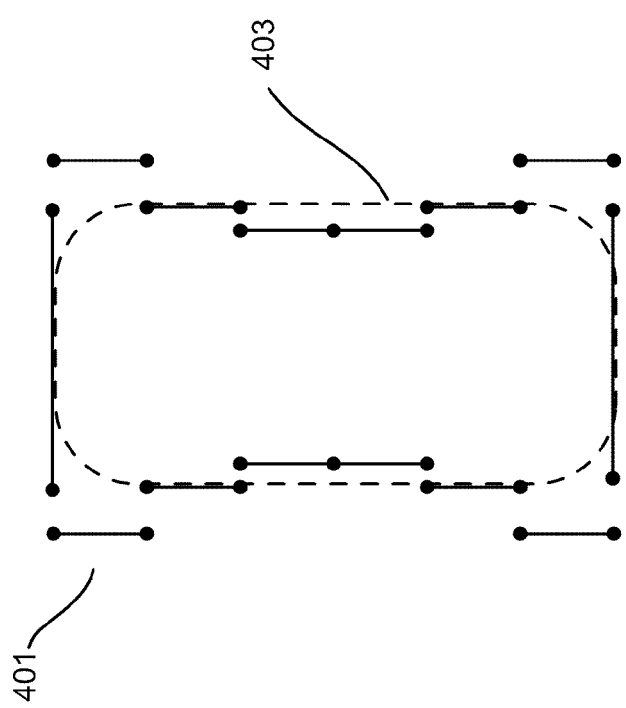
FIG. 4A illustrates the mask feature of FIG. 2, having the edges fragmented and adjusted and corresponding printed layout pattern.

FIG. 3 illustrates the mask shape 201 of FIG. 2, having an edge 303 thereof fragmented into edge fragments (often referred to as edge segments) 303A-303F. During resolution enhancement, the edge fragments 303A-303F, along with any other edge fragments generated may be moved such that a simulated printed image based upon the positioning of the moved edge fragments more closely resembles the intended image. For example, the mask shape 201 may be fragmented and modified to produce the fragmented mask shape 401 shown in FIG. 4A. As can be seen from this figure, a simulated printed image 403 based upon the modified mask shape 401 more closely resembles the mask shape 201 (i.e. the intended image) of FIG. 2 than the simulated printed image 203 does. Once the final position of the edge fragments is determined, as shown in FIG. 4A, a modified mask feature can be created from the corrected layout design data. FIG. 4B shows a modified mask feature 401', produced from the displaced edge fragments of FIG. 4A.

Optical Lithography Simulation

As indicated, resolution enhancement techniques are iterative in nature. More specifically, a printed image is simulated, the printed image is then compared to the target image, and the mask features are fragmented and adjusted based upon the comparison between the simulated image and the target image. Subsequent iterations of simulation, compare, and adjust are performed until the simulated image sufficiently matches the target image. Accordingly, accurate methods of simulating an image printed through an optical lithographic process are needed.

Various functions to approximate an optical lithographic process are used. For example, the VTR model is described in detail in U.S. Pat. No. 6,643,616, entitled "Integrated Device Structure Prediction Based On Model Curvature," filed Nov. 4, 2003, and naming Yuri Granik et al. as inventors, which patent is incorporated entirely herein by reference. Additionally, lithographic modeling based upon the Hopkins Equation is discussed in detail in *Process Variation Aware OPC with Variation Lithography Modeling*, by Peng Yu et al., Proceedings of the 43$^{rd}$ Annual Conference on Design Automation, 24-28 Jul. 2006, which article is incorporated entirely herein by reference. Often, modern lithographic models utilize kernels to approximate the various components or "effects" of the optical lithographic process.

One such kernel is the electron beam kernel, which models the electron beam effects inherent in the optical lithographic process. Electron beam effects are often modeled with double-Gaussian kernels. Use of double-Gaussian kernels to model the effects of electron beam exposure, and particularly the proximity effects of electron beam exposure, is discussed in detail in *Limitations of Proximity—Effects Corrections for Electron-Beam Patterning of Planar Photonic Crystals*, by Robert Wüest et al., Optical Engineering Vol. 44, 043401 (2005), which article is incorporated entirely herein by reference. In various implementations of the invention, the electron beam exposure is modeled with narrow kernels. Diffusion length (i.e. $\alpha$) is typically around 15-55 nanometers. A second kernel, which is typically much wider, models electron back-scattering. Its diffusion length (i.e. β) is typically around 1.6 micrometers. Accordingly, with various implementations of the invention, the proximity kernel may be represented by Equation (1) shown below.

$$K(r) = \frac{1}{\pi(1+\eta)}\left(\frac{1}{\alpha^2}e^{-\frac{r^2}{\alpha^2}} + \frac{\eta}{\beta^2}e^{-\frac{r^2}{\beta^2}}\right) \quad (1)$$

$$\int_{-\infty}^{\infty} K(x, y)dxdy = 1$$

As those of skill in the art can appreciate, electron beam exposure effects include "long range" and "short range" effects. The short range effects are often referred to herein as the proximity effects. In various implementations of the invention, the long range component of the electron beam exposure is compensated for by the Variable Etch Bias (VEB) kernel. Variable etch bias kernels are discussed in greater detail in *Correction for Etch Proximity: New Models and Applications*, by Yuri Granik, Proceeding of SPIE Vol. 4346 (2001), which article is incorporated entirely herein by reference. Alternatively, the long range effects of the electron beam exposure may be compensated for directly in the hardware of the optical lithographic process, by modulating the dose for example. Accordingly, in various implementations of the invention, the long range component of the electron beam exposure effects is ignored herein by setting it to zero (i.e. letting η=0).

As a result, a single-Guassian kernel remains, as shown in Equation (2), which is used in various implementations to approximate the proximity effects of the electron beam exposure.

$$K(r) = \frac{1}{\pi\alpha^2}e^{-\frac{r^2}{\alpha^2}} \quad (2)$$

However, use of the above described method for modeling the electron beam proximity effects of an optical lithographic process generates rounded corners. As those of skill in the art can appreciate, the tools used to manufacture optical lithographic masks, often referred to as mask writers are incapable of printing rounded features. Instead mask writers must print various geometric polygons. As a result, the rounded corners generated by simulating the proximity effects of electron beam cannot be realized in a mask.

Electron Beam Simulation Corner Correction

FIG. 5 illustrates a method 501 for correcting corners in a simulated printed image.

As can be seen from this figure, the method 501 includes an operation 503 for identifying a simulated printed image 505. In various implementations of the invention, the simulated printed image 505 is simulated in part by a function, which may be kernel based, that accounts for the electron beam exposure effects of an optical lithographic process.

With alternative implementations, the operation 503 may identify a mask, or a portion of a mask, and derive the simulated printed image 505 on a computing device. In further implementations, the mask, or portion thereof, is represented by a plurality of pixels, wherein each pixel corresponds to a level of transparency. For example, areas where it is intended that radiation pass through may have a transparency of 1, while areas where it is intended that radiation not pass through may have a transparency of 0. Accordingly, a printed image (i.e. the intensity of radiation incident upon a substrate) may be derived by Equation (3), where m represents a mask. More particularly, m(x, y) may represent a characteristic mask function, with transparency values of 0 outside the shapes or polygons and 1 inside the shapes or polygons.

$$I(x,y) = K \otimes m \quad (3)$$

As shown, the energy deposited on the substrate is proportional to the Image I, which is a convolution of the kernel and the mask. Subsequently, the final printed image, often referred to as the resist contour, may be approximated by a constant threshold resist model (CTR), for example by selecting a threshold T, and letting I(x, y)=T. In various implementations, the printed image depends upon derivation of the energy incedent on a semi-infinite plane.

Semi-Infinite Plane

The intensity for a semi-infinite plane (i.e. y≧0) may be given by Equation (4) shown below, where H is the Heaviside characteristic function.

$$I(x, y) = K \otimes m = \frac{1}{\pi\alpha^2}\int_{\xi=-\infty,\eta=-\infty}^{\infty} e^{-\frac{\xi^2}{\alpha^2}}e^{\frac{\eta^2}{\alpha^2}}H(y-\eta)d\xi d\eta \quad (4)$$

$$m(x, y) = H(y)$$

$$H(x) = \begin{cases} 0, & x < 0 \\ 1, & x \geq 0 \end{cases}$$

The solution for a semi-infinite plane, may often be simplified to that shown in Equation (5), where "err" is the Gaussian error function. It is important to note that independently on the diffusion length α, the contour I=0.5 always stays on the boundary y=0 of the semi-infinite plane.

$$I(x, y) = \frac{1}{2}\left(1 + \text{erf}\left(\frac{y}{\alpha}\right)\right) \quad (5)$$

Returning to FIG. 5, the method 501 further includes an operation 507 for approximating one or more of the corners in the simulated printed image 505, resulting in an approximate simulated image 509. FIG. 6 illustrates a method 601 that may be employed in various implementations to approximate a corner of a simulated printed image. In various implementations, the operation 507 may iteratively perform the method 601 to approximate one or more corners within the simulated printed image 505.

As can be seen from FIG. 6, the method 601 includes an operation 603 for identifying a corner, an operation 605 for deriving a first line end (i.e. referred to herein as "P1"), an operation 607 for deriving a second line end (i.e. referred to herein as "P2"), an operation 609 for deriving a corner apex (i.e. referred to herein as "C"), and an operation 611 for generating an approximated corner 613 by forming straight lines with orientations based upon the first line end P1, the second end P2, and the apex C.

In various implementations, the operations 605 through 609 may derive the line ends P1 and P2, and the apex C based upon the type or corner identified by the operation 603. Accordingly, derivation of the line ends P1 and P2, and the apex C for various illustrative corner types, such as an isolated straight (i.e. 90 degree) corner for example is described herein.

Isolated Straight Corners

Consider a convolution of the straight corner x>0, y>0:

$$I(x, y) = K \otimes m \quad (6)$$

$$= \frac{1}{\pi\alpha^2} \int_{\xi=-\infty, \eta=-\infty}^{\infty} e^{-\frac{\xi^2}{\alpha^2}} e^{\frac{\eta^2}{\alpha^2}} H(x-\xi)H(y-\eta)d\xi d\eta$$

$$m(x, y) = H(x)H(y)$$

Which may be reduced as follows:

$$I(x, y) = \frac{1}{\pi\alpha^2} \int_{\xi=-\infty, \eta=-\infty}^{\xi=x, \eta=y} e^{-\frac{\xi^2}{\alpha^2}} e^{\frac{\eta^2}{\alpha^2}} d\xi d\eta = \quad (7)$$

$$\frac{1}{\pi\alpha^2} \int_{\xi=-\infty, \eta=-\infty}^{\xi=x} e^{-\frac{\xi^2}{\alpha^2}} d\xi \cdot \int_{\xi=-\infty, \eta=-\infty}^{\eta=y} e^{\frac{\eta^2}{\alpha^2}} d\eta =$$

$$\frac{1}{\pi} \int_{\rho=-\infty}^{x/\alpha} e^{-\rho^2} d\rho \bigg|\xi/\alpha = \rho \cdot \int_{v=-\infty}^{y/\alpha} e^{-v^2} dv \bigg|\eta/\alpha = v =$$

$$\frac{1}{\pi}\left[\int_{\rho=-\infty}^{0} e^{-\rho^2} d\rho + \int_{0}^{x/\alpha} e^{-\rho^2} d\rho\right]\left[\int_{v=-\infty}^{0} e^{-v^2} dv + \int_{0}^{y/\alpha} e^{-v^2} dv\right] =$$

$$\frac{1}{\pi}\left[\int_{0}^{\infty} e^{-\rho^2} d\rho + \int_{0}^{x/\alpha} e^{-\rho^2} d\rho\right]\left[\int_{0}^{\infty} e^{-v^2} dv + \int_{0}^{y/\alpha} e^{-v^2} dv\right] =$$

$$\frac{1}{\pi}\left[\frac{\sqrt{\pi}}{2} + \int_{0}^{x/\alpha} e^{-\rho^2} d\rho\right]\left[\frac{\sqrt{\pi}}{2} + \int_{0}^{y/\alpha} e^{-v^2} dv\right] =$$

$$\frac{1}{\pi}\left(\frac{\sqrt{\pi}}{2} + \frac{\sqrt{\pi}}{2}\text{erf}\left(\frac{y}{\alpha}\right)\right)\left(\frac{\sqrt{\pi}}{2} + \frac{\sqrt{\pi}}{2}\text{erf}\left(\frac{x}{\alpha}\right)\right)$$

Figure 7:
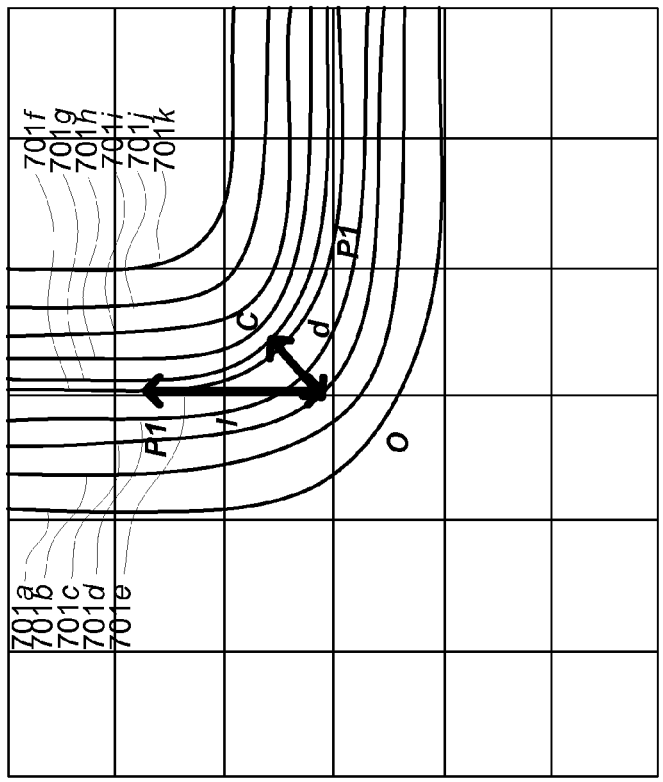
FIG. 7 illustrates simulated layout contours.

FIG. 7 illustrates the solution to Equation (6), which may, in some implementations, be generated by the operation 503 of FIG. 5. More particularly, FIG. 7 illustrates simulated layout contours 701$a$ though 701$k$, which have been simulated for a selection of thresholds T, with α=1. For example, the simulated contour 701$f$ is for a threshold of 0.5. FIG. 7 further illustrated the apex C corresponding to the corner of the simulated contour 701$f$, a distance l, which is the distance to a point where the corner of the simulated contour 701$f$ merges into the line of the simulated contour 701$f$, and the pullback d. The pullback d may be determined by solving Equation (6) with x=y, as shown below for the simulated contour 701$f$.

$$\frac{1}{4}\left(1 + \text{erf}\left(\frac{x}{\alpha}\right)\right)\left(1 + \text{erf}\left(\frac{x}{\alpha}\right)\right) = 0.5 \quad (8)$$

$$\text{erf}\left(\frac{x}{\alpha}\right) = \sqrt{2} - 1 = 0.414214$$

$$\frac{x}{\alpha} = 0.3853395 \rightarrow y_c = x_c = 0.3853395\alpha$$

As the pullback d is the hypotenuse of a triangle, d may be found by solving the following.

$$d = \sqrt{2}x_c = 0.5449523\alpha \quad (9)$$

Assuming that the simulated contour 701$f$ merges into the line at the distance l from the corner, one may set x=0, T=0.5-5%=0.475, represented by the following.

$$\frac{1}{4}\left(1 + \text{erf}\left(\frac{l}{\alpha}\right)\right) = 0.475 \quad (10)$$

$$\text{erf}\left(\frac{l}{\alpha}\right) = 0.9$$

$$l = \text{erf}^{-1}(0.9) \cdot \alpha$$

$$l = 1.163\alpha$$

Figure 8:
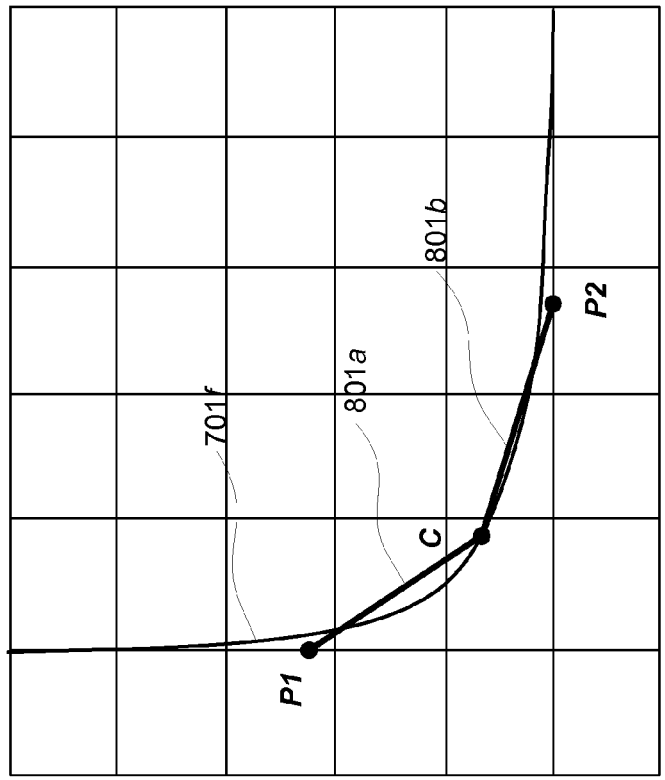
FIG. 8 illustrates a simulated layout contour of FIG. 7 and a corresponding corner approximation.

Subsequently, the operation 611 may replace the corner of the simulated contour 701$f$ with straight edges based upon the derived values of d and l, as shown in FIG. 8. As can be seen in this figure, the simulated contour 701$f$ has its corner replaced by two straight lines 801$a$ and 801$b$. It is important to note, that any errors inherent in the approximation of the corner is maximized at points P1 (x=0, y=) and P2. While a value of 0.5 is idea for point P1 (when T=0.5), the intensity I at this point is 0.475. As a result, the error is 5% by intensity. Another estimate of the error may be approximated as the maximum distance from the edges to the simulated contour 701, which error may conveniently be graphically estimated.

Line Ends

Figure 9:
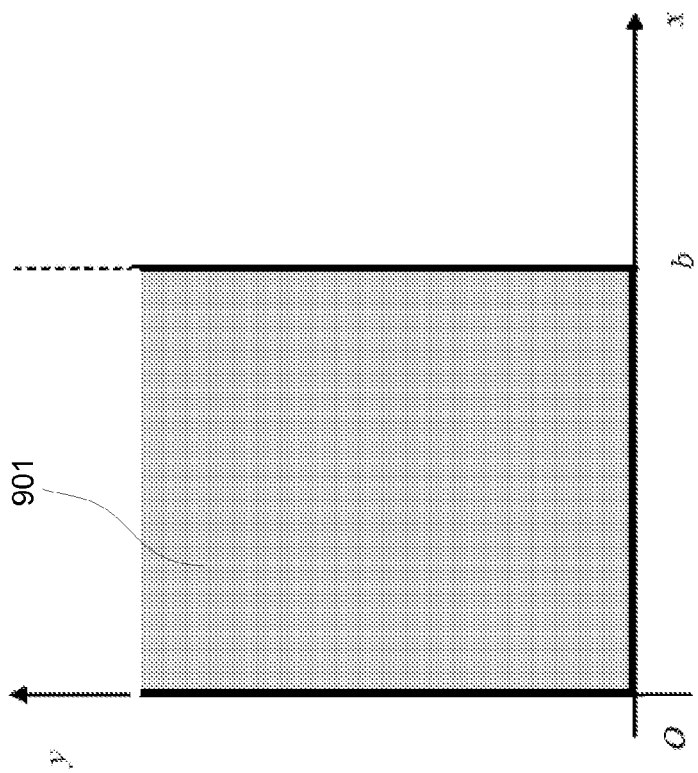
FIG. 9 illustrates a line end layout shape.

FIG. 9 illustrates an isolated line end shape 901. As can be seen from this figure, a line end is defined as two convex corners that meet or come together. Various implementations of the invention may express a mask for a line end as follows.

$$m(x,y) = H(x)H(y) + H(b-x)H(y) - H(y) \quad (11)$$

As shown by Equation (11), a mask may be defined as a semi-infinite strip, with the mask value equaling 1 inside the strip and 0 outside the strip. Using the properties of linearity of convolution, the solution for I may be written as a combination of Equation (5) and Equation (7), as shown below.

$$I(x, y) = \frac{1}{4}\left(1 + \text{erf}\left(\frac{x}{\alpha}\right)\right)\left(1 + \text{erf}\left(\frac{y}{\alpha}\right)\right) + \quad (12)$$

$$\frac{1}{4}\left(1 + \text{erf}\left(\frac{b-x}{\alpha}\right)\right)\left(1 + \text{erf}\left(\frac{y}{\alpha}\right)\right) - \frac{1}{2}\left(1 + \text{erf}\left(\frac{y}{\alpha}\right)\right) =$$

$$I(x, y) = \frac{1}{4}\left(\text{erf}\left(\frac{b-x}{\alpha}\right) + \text{erf}\left(\frac{x}{\alpha}\right)\right)\left(1 + \text{erf}\left(\frac{y}{\alpha}\right)\right)$$

Figure 10:
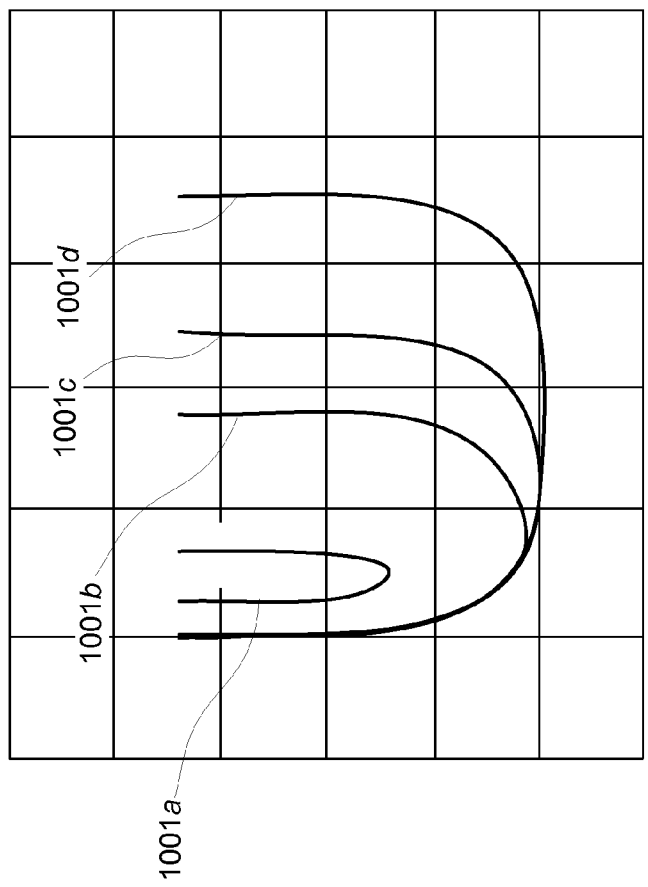
FIG. 10 illustrates simulated line end contours.

FIG. 10 illustrates simulated line end contours 1001$a$ through 1001$d$, derived by solving the equation above for T=0.5 and b=1α, 2α, 2.75α, 4α respectively. With various implementations of the invention, the line end corners may be approximated by first identifying a proper threshold for when the lines begin to interact, which may be accomplished by first setting x=0, y=∞, which allows one to reduce Equation (12) as shown below.

$$T = \frac{1}{4}\left(\text{erf}\left(\frac{b-x}{\alpha}\right) + \text{erf}\left(\frac{x}{\alpha}\right)\right)1 + \text{erf}\left(\frac{y}{\alpha}\right) = 0.5 \cdot \text{erf}\left(\frac{b}{\alpha}\right) \quad (13)$$

The width of the line end should be determined based in part upon the requirement that the corners do not interact, which could result in line end pullback. The line end pullback p may be derived from x=b/2, y=p, which is shown below.

$$\frac{1}{4}(\text{erf}(b-x) + \text{erf}\,x)(1 + \text{erf}(y)) = 0.5 \cdot \text{erf}(b) \quad (14)$$

$$\text{erf}\left(\frac{b}{2}\right)(1 + \text{erf}(y)) = \text{erf}(b)$$

$$\text{erf}(y) = \frac{\text{erf}(b)}{\text{erf}\left(\frac{b}{2}\right)} - 1$$

$$p - \text{erf}^{-1}\left(\frac{\text{erf}(b)}{\text{erf}\left(\frac{b}{2}\right)} - 1\right)$$

In various implementations, it is desirable to keep the line end pullback p less that y=0.05α. Accordingly, Equation (14) may be reduced to $$\frac{b}{\alpha} \geq 2.73,$$

which states that the corners of the line end do not interact if b≧2.73α. Accordingly, the corners may be corrected separately as shown in FIG. 11.

Figure 11:
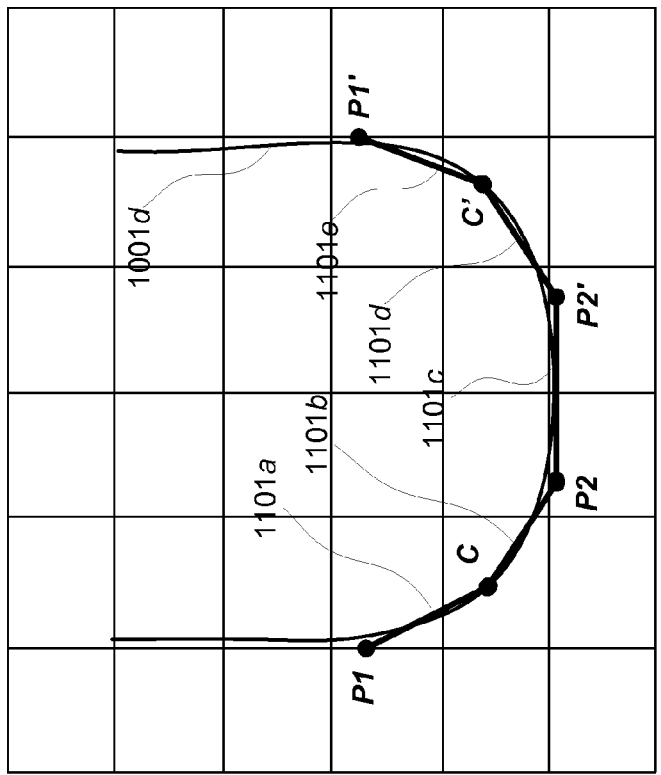
FIG. 11 illustrates a simulated line end contour of FIG. 10 and a corresponding corner approximation.

FIG. 11 illustrates the simulated line end contour 1001d (i.e. where b=4α), having each corner replaced approximated individually, as described previously with reference to isolated straight corners. As can be seen from this figure, the line end contour 1001d has the corners approximated with five straight edges 1101a through 1101e, having end points of (P1, C), (C, P2), (P2, P2'), (P2', C'), and (C', P1') respectively.

The line end pullback for corners that interact are a function of b/α as stated above, and may be found through Equation (14) and approximated as shown below. The approximation is valid for the interval 1<b/α<4. It is important to note, that a maximum error for this approximation is estimated at 0.002.

$$\frac{p}{\alpha} = \text{erf}^{-1}\left(\frac{\text{erf}\left(\frac{b}{\alpha}\right)}{\text{erf}\left(\frac{b}{2\alpha}\right)} - 1\right) \quad (15)$$

$$\frac{p}{\alpha} = 1.71 \cdot e^{-\left(\frac{b}{\alpha}\right)^{1.123}} - 0.003 \quad (16)$$

Deriving of the Coordinates of the Point P1 for Interacting Corners

In various implementations of the invention, the location for the point P1 is determined based upon the condition for a line end that does not interact. More particularly, $P_1$=(0,l), where l is derived based upon Equation (10).

Derivation of the Coordinates of the Corner C for Interacting Corners

When line ends begin interacting, the location of the corner C is no longer on the diagonal. Instead, the corner location may be derived as follows.

$$x^2 + (y - p)^2 \to \min \quad (17)$$

$$\frac{1}{4}(\text{erf}(b-x) + \text{erf}(x))(1 + \text{erf}(y)) = 0.5 \cdot \text{erf}(b)$$

A Lagrangian may be constructed using dimensionless variables (i.e. all variables divided by α) as follows:

$$L(x,y,\lambda) = x^2 + (y-p)^2 + \lambda[(\text{erf}(x)+\text{erf}(b-x))(1+\text{erf}(y)) - 2\cdot\text{erf}(b)] \to \min \quad (18)$$

Taking the derivatives of Equation (18) yields the following:

$$\frac{\partial L}{\partial x} = 2x + \frac{2}{\sqrt{\pi}}\lambda\left(e^{-x^2} - e^{-(b-x)^2}\right)(1 + \text{erf}\,y) = 0 \quad (19)$$

$$\frac{\partial L}{\partial y} = 2y - 2p + \frac{2}{\sqrt{\pi}}\lambda(\text{erf}(x) + \text{erf}(b-x))e^{-y^2} = 0$$

$$\frac{\partial L}{\partial \lambda} = (\text{erf}(x) + \text{erf}(b-x))(1 + \text{erf}(y)) - 2 \cdot \text{erf}(b) = 0$$

λ may be eliminated from the first and second derivatives from Equation (19), by substituting p from Equation (14). This results in two equations (i.e. curves) in the x, y plane that depend upon b as shown below.

$$y + x\frac{\text{erf}(x) + \text{erf}(b-x)}{\left(e^{y^2-(b-x)^2} - e^{y^2-x^2}\right)(1+\text{erf}(y))} - \text{erf}^{-1}\left(\frac{\cdot\text{erf}(b)}{\text{erf}(b/2)} - 1\right) = 0 \quad (20)$$

$$(\text{erf}(x) + \text{erf}(b-x))(1 + \text{erf}(y)) - 2\cdot\text{erf}(b) = 0$$

One may solve for y in the third derivative from Equation (19) and substitute the solution into the first curve from Equation (20), as shown.

$$y = \text{erf}^{-1}\left(2\cdot\frac{\text{erf}(b)}{\text{erf}(x) + \text{erf}(b-x)} - 1\right) \quad (21)$$

$$y + x\frac{\text{erf}(x) + \text{erf}(b-x)}{(e^{y^2-(b-x)^2} - e^{y^2-x^2})(1+\text{erf}(y))} - \text{erf}^{-1}\left(\frac{\cdot\text{erf}(b)}{\text{erf}(b/2)} - 1\right) = 0$$

As can be seen from Equation (21), the curves depend upon b and x. Accordingly, the x and y coordinates for point C, may be approximated by the following Equations.

$$\frac{x_c}{\alpha} = 0.162 \cdot \text{erf}\left(0.75\left(\frac{b}{\alpha} - 1\right)\right) + 0.2184 \quad (22)$$

$$\frac{y_c}{\alpha} = \text{erf}^{-1}\left(\frac{2\cdot\text{erf}\left(\frac{b}{\alpha}\right)}{\text{erf}\left(\frac{x_c}{\alpha}\right) + \text{erf}\left(\frac{b}{\alpha} - \frac{x_c}{\alpha}\right)} - 1\right)$$

Derivation of the Coordinates of the Point P2 for Interacting Corners

In various implementations of the invention, the coordinates for the point P2 may be derived as follows.

$$P_2 = (x_{p2}, p) \quad (23)$$

In various implementations the x coordinate is found heuristically as being 7/12 from the corner C to the middle of the line, as shown.

$$x_{p2} = x_c + \frac{7}{12}\left(\frac{b}{2\alpha} - x_c\right) \quad (24)$$

The y coordinate may be found as follows.

$$y_{p2} = \text{erf}^{-1}\left(\frac{2\cdot\text{erf}\left(\frac{b}{\alpha}\right)}{\text{erf}\left(\frac{x_{p2}}{\alpha}\right)+\text{erf}\left(\frac{b}{\alpha}-\frac{x_{p2}}{\alpha}\right)}-1\right) \quad (25)$$

Figure 12:
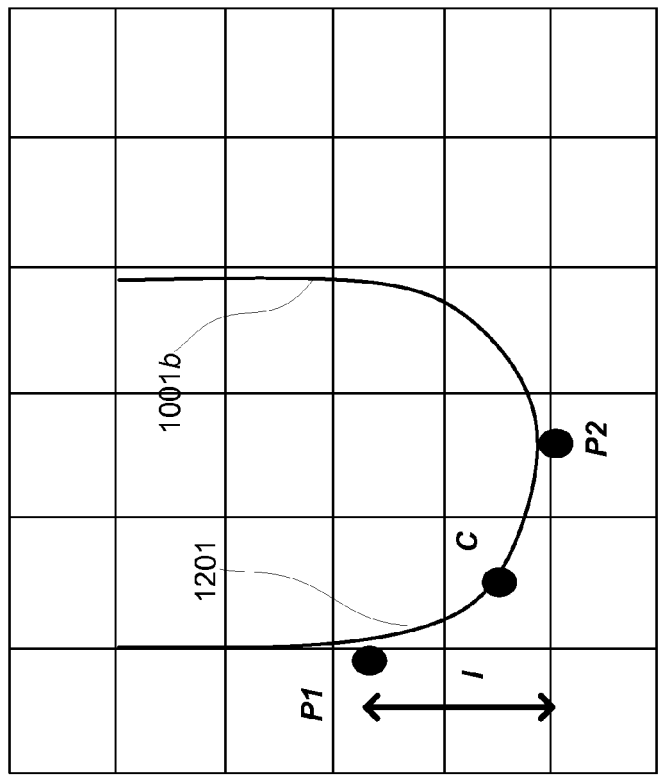
FIG. 12 illustrates a simulated line end contour of FIG. 10.

FIG. 12 illustrates the simulated line end contour 1001b from FIG. 10. As described above, the corners of the simulated line end contour 1001b interact (i.e. b=2≦2.73). As can be seen from FIG. 12, the line ends P1, P2, and the apex C for the left corner 1201 of the contour are shown.

Isolated Corners

For isolated corners of angle θ, the intensity I may be represented as follows.

$$I(r,\gamma) = K \otimes m = \frac{1}{\pi\alpha^2}\int_{\rho=0}^{\infty}\int_{\varphi=0}^{\theta} e^{-\frac{(\rho\cos\varphi-x)^2+(\rho\sin\varphi-y)^2}{\alpha^2}}\rho\,d\rho\,d\varphi \quad (26)$$

$$x = r\cos\gamma, \; y = r\sin\gamma$$

Which in dimensionless coordinates may be written as:

$$I(r,\gamma) = \frac{1}{\pi}\int_{\rho=0}^{\infty}\int_{\varphi=0}^{\theta} e^{-(\rho\cos\varphi-x)^2+\frac{(\rho\sin\varphi-y)^2}{a^2}}\rho\,d\rho\,d\varphi \quad (27)$$

$$x = r\cos\gamma, \; y = r\sin\gamma$$

Transforming the power of the exponent yields:

$$(\rho\cdot\cos\varphi-x)^2+(\rho\cdot\sin\varphi-y)^2=\rho^2\cdot\cos^2\varphi-2\rho x\cos\varphi+x^2+\rho^2\cdot\sin^2\varphi-2\rho y\sin\varphi+y^2=\rho^2-2\rho(x\cos\varphi+y\sin\varphi)+r^2=\rho^2-2\rho(r\cos\gamma\cos\varphi+r\sin\gamma\sin\varphi)+r^2=\rho^2-2\rho r\cos(\gamma-\varphi)+r^2=\rho^2-2\rho r\cos(\gamma-\varphi)+(r\cos(\gamma-\varphi))^2-(r\cos(\gamma-\varphi))^2=(\rho-r\cos(\gamma-\varphi))^2+r^2(1+\cos^2(\gamma-\varphi))=(\rho-a)^2+r^2-a^2, a=r\cos(\gamma-\varphi) \quad (28)$$

As a result:

$$I(r,\gamma) = \frac{1}{\pi}\int_{\rho=0}^{\infty}\int_{\varphi=0}^{\theta} e^{-(\rho-a)^2}e^{-r^2+a^2}\rho\,d\rho\,d\varphi \quad (29)$$

$$= \frac{1}{\pi}\int_{\varphi=0}^{\theta} e^{-r^2+a^2}\int_{\rho=0}^{\infty} e^{-(\rho-a)^2}(\rho-a+a)d\rho\,d\varphi$$

$$= \frac{e^{-r^2}}{\pi}\int_{\varphi=0}^{\theta} e^{a^2}\left[\int_{\rho=0}^{\infty} e^{-(\rho-a)^2}\left(\frac{\rho-a}{a}\right)d\rho + a\int_{\rho=0}^{\infty} e^{-(\rho-a)^2}d\rho\right]d\varphi$$

$$= \frac{e^{-r^2}}{\pi}\int_{\varphi=0}^{\theta} e^{a^2}\left[\int_{\rho=-a}^{\infty} e^{-\rho^2}\rho\,d\rho + a\int_{\rho=-a}^{\infty} e^{-\rho^2}d\rho\right]d\varphi$$

Simplifying the equations even further:

$$\int_{\rho=-a}^{\infty} e^{-\rho^2}\rho\,d\rho + a\int_{\rho=-a}^{\infty} e^{-\rho^2}d\rho = \int_{\rho=-a}^{\infty} e^{-\rho^2}\rho\,d\rho + \quad (30)$$

-continued $$\int_0^{\infty} e^{-\rho^2}\rho\,d\rho +$$

$$a\cdot\frac{\sqrt{\pi}}{2}\text{erfc}(-a)$$

$$= \int_{\rho=-a}^{\infty} e^{-\rho^2}\rho\,d\rho +$$

$$\frac{1}{2}\int_0^{\infty} e^{-\rho^2}d\rho^2 +$$

$$a\cdot\frac{\sqrt{\pi}}{2}\text{erfc}(-a)$$

$$= -\frac{1}{2}\int_{t=0}^{a^2} e^{-t}dt + \frac{1}{2} +$$

$$a\cdot\frac{\sqrt{\pi}}{2}\text{erfc}(-a)$$

$$= -\frac{1}{2}+\frac{1}{2}e^{-a^2}+\frac{1}{2} +$$

$$a\cdot\frac{\sqrt{\pi}}{2}\text{erfc}(-a)$$

$$= \frac{1}{2}e^{-a^2}+a\cdot\frac{\sqrt{\pi}}{2}\text{erfc}(-a)$$

Substituting Equation (30) into Equation (29) yields:

$$I(r,\gamma) = \frac{e^{-r^2}}{\pi}\int_{\varphi=0}^{\theta} e^{a^2}\left[\frac{1}{2}e^{-a^2}+a\cdot\frac{\sqrt{\pi}}{2}\text{erfc}(-a)\right]d\varphi \quad (31)$$

$$= \frac{e^{-r^2}}{2\pi}\int_{\varphi=0}^{\theta}\left[1+\sqrt{\pi}\cdot a\cdot e^{a^2}\text{erfc}(-a)\right]d\varphi$$

$$= \frac{e^{-r^2}\theta}{2\pi}+\frac{1}{2\sqrt{\pi}}\int_{\varphi=0}^{\theta} a\cdot e^{-r^2+a^2}\text{erfc}(-a)d\varphi$$

Considering the last integral:

$$\int_{\varphi=0}^{\theta} a\cdot e^{-r^2+a^2}\text{erfc}(-a)d\varphi = \int_{\phi=-\gamma}^{\theta-\gamma} a\cdot e^{-r^2+a^2}\left(\frac{1+\text{erf}(a)}{}\right)d\varphi\Big|_{\phi=\varphi-\gamma} = \quad (32)$$

$$\int_{\phi=-\gamma}^{\theta-\gamma} r\cos\phi\cdot e^{-r^2\sin^2\phi}d\phi\Big|_{dt=r\cos\phi d\phi}^{r\sin\phi=t}+\int_{\phi=-\gamma}^{\theta-\gamma} a\cdot e^{-r^2+a^2}\text{erf}(a)d\phi =$$

$$\int_{t=r\sin\gamma}^{r\sin(\theta-\gamma)} e^{-t^2}dt + \int_{\phi=-\gamma}^{\theta-\gamma} a\cdot e^{-r^2+a^2}\text{erf}(a)d\phi =$$

$$\frac{\sqrt{\pi}}{2}\text{erf}(r\sin(\theta-\gamma))+\frac{\sqrt{\pi}}{2}\text{erf}(r\sin\gamma)+$$

$$\int_{\phi=-\gamma}^{\theta-\gamma} a\cdot e^{-r^2+a^2}\text{erf}(a)d\phi$$

One may use the above simplifications to solve for the intensity I, as shown:

$$I(r,\gamma) = \frac{\theta}{2\pi}e^{-r^2}+\frac{1}{4}\text{erf}(r\sin(\theta-\gamma))+ \quad (33)$$

$$\frac{1}{4}\text{erf}(r\sin\gamma)+\frac{1}{2\sqrt{\pi}}\int_{\phi=-\gamma}^{\theta-\gamma} a\cdot e^{-r^2+a^2}\text{erf}(a)d\phi$$

Acute Angles Less than or Equal to 45 Degrees

For acute angles less than or equal for 45 degrees, the corner may be approximated by replacing erf (r cos φ) by its average value (i.e. θ/2-γ), which yields the following in dimensional coordinates.

$$I(r,\gamma) \approx \frac{\theta}{2\pi}e^{\frac{r^2}{\alpha^2}} + \frac{1+\text{erf}\left(\frac{r}{\alpha}\cos\theta/2-\gamma\right)}{4}\text{erf}\left(\frac{r}{\alpha}\sin(\theta-\gamma)\right) + \frac{1+\text{erf}\left(\frac{r}{\alpha}\cos\theta/2-\gamma\right)}{4}\text{erf}\left(\frac{r}{\alpha}\sin\gamma\right) \quad (34)$$

Which can be simplified by removing the polar angle γ:

$$I\left(x,y;\theta\le\gamma\le\frac{\pi}{4}\right)\approx\frac{\theta}{2\pi}e^{-r^2}+ \quad (35)$$
$$\frac{1}{4}[1+\text{erf}(r\cos(\theta/2-\gamma))][\text{erf}(r\sin(\theta-\gamma))\text{erf}(r\sin\gamma)] =$$
$$\frac{\theta}{2\pi}e^{-r^2}+\frac{1}{4}\left[1+\text{erf}\left(r\left(\cos\frac{\theta}{2}\cos\gamma+\sin\frac{\theta}{2}\sin\gamma\right)\right)\right][\text{erf}(r(\sin\theta\cos\gamma-\cos\theta\sin\gamma))+\text{erf}(\gamma)] =$$
$$\frac{\theta}{2\pi}e^{-r^2}+\frac{1}{4}\left[1+\text{erf}\left(x\cos\frac{\theta}{2}+y\sin\frac{\theta}{2}\right)\right][\text{erf}(x\sin\theta-y\sin\theta)+\text{erf}(y)]$$

It should be noted that Equation (35) has an accuracy of $10^{-3}$ for angles less than 45 degrees. In various implementations of the present invention, a simulated acute angled corner of less than 45 degrees may be approximated by deriving the offset of line ends P1 and P2 from a simulated contour having the condition that the threshold T=0.475 and the contour intersects y=0, which is the same conditions described with reference to Equation (10) above. Solving Equation (35) for these conditions, one may derive x coordinates by solving the following Equation for x.

$$\frac{\theta}{2\pi}e^{-x^2}+\frac{1+\text{erf}(x\cos(\theta/2))}{4}\text{erf}(x\sin(\theta))-0.465=0 \quad (36)$$

Which may be approximated as follows:

$$x_p=\left(\frac{1.34}{\sin\theta}+0.061\right)\alpha \quad (37)$$

For the case of an angle equaling 45 degrees:

$$x_{p,45}=1.956\alpha \quad (38)$$

Acute Angles Greater than 45 Degrees

For acute angles greater than 45 degrees, the corner may be approximated by subtracting the solution for acute angels less than or equal to 45 degrees (i.e. as shown by Equation (33) or Equation (35) and subsequently "flipping" the axes, as shown here:

$$I\left(r,\gamma;\theta\le\gamma\le\frac{\pi}{2}\right)\approx-\frac{\theta}{2\pi}e^{-r^2}- \quad (39)$$

-continued
$$\frac{1}{4}\left[1+\text{erf}\left(x\cos\frac{\theta}{2}+y\sin\frac{\theta}{2}\right)\right][\text{erf}(x\sin\theta-y\cos\theta)+\text{erf}(y)] +$$
$$\frac{1}{4}(1+\text{erf}(x))(1+\text{erf}(y))$$

Flipping the axes and simplifying yields:

$$I(x,y;0\le\gamma\le\theta)\approx\left(\frac{\theta}{2\pi}-\frac{1}{4}\right)e^{-r^2}- \quad (40)$$
$$\frac{1}{4}\left[1+\text{erf}\left(y\cos\left(\frac{\pi}{4}-\frac{\theta}{2}\right)+x\sin\left(\frac{\pi}{4}-\frac{\theta}{2}\right)\right)\right][\text{erf}(y\cos\theta-x\sin\theta)+$$
$$\text{erf}(x)]+\frac{1}{4}(1+\text{erf}(x))(1+\text{erf}(y))$$

In various implementations, the offset of the line ends P1 and P2 may be derived by solving for the condition that T=0.475 intersects y=0, which is the same conditions described with reference to Equation (10) above. Accordingly, one may derive:

$$\left(\frac{\theta}{2\pi}-\frac{1}{4}\right)e^{-x^2}-\frac{1}{4}\left[1+\text{erf}\left(x\sin\left(\frac{\pi}{4}-\frac{\theta}{2}\right)\right)\right][\text{erf}(x)-\text{erf}(x\sin\theta)]+ \quad (41)$$
$$\frac{1}{4}(1+\text{erf}(x))-0.475=0$$

Which may be approximated as:

$$x_p=\left(\frac{1.0507}{\theta^{1.15}}+0.538\right)\alpha \quad (42)$$

In various implementations, the apex C may be derived by letting γ=θ/2, which yields:

$$x=r\cos(\theta/2) \quad (43)$$
$$y=r\sin(\theta/2)$$
$$\left(\frac{\theta}{2\pi}-\frac{1}{4}\right)e^{-r^2}-$$
$$\frac{1}{4}\left[1+\text{erf}\left(y\cos\left(\frac{\pi}{4}-\frac{\theta}{2}\right)+x\sin\left(\frac{\pi}{4}-\frac{\theta}{2}\right)\right)\right][\text{erf}(y\cos\theta-x\sin\theta)+$$
$$\text{erf}(x)]+\frac{1}{4}(1+\text{erf}(x))(1+\text{erf}(y))=0.5$$

Which may be approximated as follows:

$$r_c=\left(\frac{1}{\theta}-0.03\cdot\theta^2-0.02\right)\alpha \quad (44)$$
$$x_c=r_c\cos\frac{\theta}{2},\, y_c=r_c\sin\frac{\theta}{2}$$

Obtuse Angles Less than or Equal to 135 Degrees

For obtuse angles less than or equal for 135 degrees, the corner may be approximated by adding the solution for an isolated straight corner and the solution for an acute angle of less than 45 degrees that has been rotated counterclockwise by 90 degrees. More particularly, x→y, y→-x, θ→θ-π/2, which yields:

$$I\left(x, y; \frac{\pi}{2} \leq \theta \leq \frac{3\pi}{4}\right) \approx \frac{1}{4}(1 + \mathrm{erf}\,x)(1 + \mathrm{erf}\,y) + \frac{\theta - \pi/2}{2\pi}e^{-r^2} + \tag{45}$$

$$\frac{1}{4}\left[1 + \mathrm{erf}\left(y\cos\left(\frac{\theta}{2} - \frac{\pi}{4}\right) - x\sin\left(\frac{\theta}{2} - \frac{\pi}{4}\right)\right)\right][\mathrm{erf}(x\sin\theta - y\sin\theta) - \mathrm{erf}(x)]$$

In various implementations, the offset of the line ends P1 and P2 may be derived by solving for the condition that T=0.475 and intersects y=0, which is the same conditions described with reference to Equation (10) above. Solving Equation (45) for these conditions, one may derive x coordinates by solving the following Equation for x.

$$\frac{1}{4}(1 + \mathrm{erf}\,x) + \frac{\theta - \pi/2}{2\pi}e^{-x^2} + \tag{46}$$

$$\frac{1}{4}\mathrm{erfc}\left(x\sin\left(\frac{\theta}{2} - \frac{\pi}{4}\right)\right)[\mathrm{erf}(x\sin\theta) - \mathrm{erf}\,x] = 0.475$$

Which may be approximated as follows:

$$x_p/\alpha = 1.798 - 0.839\sqrt{\theta - 1} \tag{47}$$

With various implementations, the apex C may be solved for by letting $\gamma = \theta/2$, T=0.5, which yields:

$$x = r\cos(\theta/2) \tag{48}$$
$$y = r\sin(\theta/2)$$

$$\frac{1}{4}(1 + \mathrm{erf}(x))(1 + \mathrm{erf}(y)) + \frac{\theta - \pi/2}{2\pi}e^{-r^2} +$$

$$\frac{1}{4}\left[1 + \mathrm{erf}\left(y\cos\left(\frac{\theta}{2} - \frac{\pi}{4}\right) - x\sin\left(\frac{\theta}{2} - \frac{\pi}{4}\right)\right)\right][\mathrm{erf}(x\sin\theta - y\cos\theta) + \mathrm{erf}(x)] = 0.5$$

Which may be further approximated by:

$$r_c = (0.7345 - 0.253 \cdot \theta + e^{-\theta})\alpha \tag{49}$$
$$x_c = r_c\cos\frac{\theta}{2}, \quad y_c = r_c\sin\frac{\theta}{2}$$

Obtuse Angles Greater than 135 Degrees

For obtuse angle greater than 135 degrees, the corner may be approximated by subtracting from the solution for an acute angle of less than 45 degrees that has been flipped along the y axis. More particularly, x→-x, y→y, θ→π-θ. Accordingly, one may derive:

$$I\left(x, y; \frac{3\pi}{4} \leq \theta \leq \pi\right) \approx \frac{1}{2}(1 + \mathrm{erf}(y)) - \frac{\pi - \theta}{2\pi}e^{-r^2} - \tag{50}$$

$$\frac{1}{4}\left[1 + \mathrm{erf}\left(-x\cos\left(\frac{\pi}{2} - \frac{\theta}{2}\right) + y\sin\left(\frac{\pi}{2} - \frac{\theta}{2}\right)\right)\right]$$

$$[\mathrm{erf}(-x\sin\theta + y\cos\theta) + \mathrm{erf}(y)]$$

$$= \frac{1}{2}(1 + \mathrm{erf}(y)) - \frac{\pi - \theta}{2\pi}e^{-r^2} -$$

$$\frac{1}{4}\left[1 + \mathrm{erf}\left(y\cos\left(\frac{\theta}{2}\right) - x\sin\left(\frac{\theta}{2}\right)\right)\right]$$

$$[\mathrm{erf}(y\cos\theta - x\sin\theta) + \mathrm{erf}(y)]$$

In various implementations, the offset of the line ends P1 and P2 may be derived by finding a critical angle (i.e. $\theta_{critical}$) for which the contour having a threshold of T=0.475 and being located as coordinates x=0 and y=0. Substituting the given conditions into Equation (50) yields:

$$\frac{1}{2} - \frac{\pi - \theta}{2\pi} = 0.475 \tag{51}$$

$$\theta_{critical} = 0.95\pi \approx 171°$$

Accordingly, the line ends P1 and P2 may be found by solving for the condition that T=0.475 intersects y=0, which is the same conditions described with reference to Equation (10) above and shown below:

$$\frac{1}{2} - \frac{\pi - \theta}{2\pi}e^{-x^2} - \frac{1}{4}\left[1 - \mathrm{erf}\left(x\sin\left(\frac{\theta}{2}\right)\right)\right][-\mathrm{erf}(x\sin\theta)] = 0.475 \tag{52}$$

$$\frac{1}{2} - \frac{\pi - \theta}{2\pi}e^{-x^2} - \frac{1}{4}\mathrm{erfc}\left(x\sin\left(\frac{\theta}{2}\right)\right)\mathrm{erf}(x\sin\theta) = 0.475$$

For angles $\theta < \theta_{critical}$, the line ends P1 and P2 may be approximated by the following:

$$x_p/\alpha = 0.9 + 0.45 \cdot \ln(\pi - \theta - 0.02) \tag{53}$$

Various implementation of the invention may derive the apex C by letting $\gamma = \theta/2$, T=0.5, which yields:

$$x = r\cos(\theta/2) \tag{54}$$
$$y = r\sin(\theta/2)$$

$$\frac{1}{2}(1 + \mathrm{erf}(y)) - \frac{\pi - \theta}{2\pi}e^{-r^2} -$$

$$\frac{1}{4}\left[1 + \mathrm{erf}\left(y\cos\left(\frac{\theta}{2}\right) - x\sin\left(\frac{\theta}{2}\right)\right)\right][\mathrm{erf}(y\cos\theta - x\sin\theta) + \mathrm{erf}(y)] = 0.5$$

Which may be approximated as follows:

$$r_c = \left(0.2308 - 0.2967 \cdot \left(\theta - \frac{3\pi}{4}\right)\right)\alpha \tag{55}$$

$$x_c = r_c\cos\frac{\theta}{2}, \quad y_c = r_c\sin\frac{\theta}{2}$$

Straight Jogs

Figure 13:
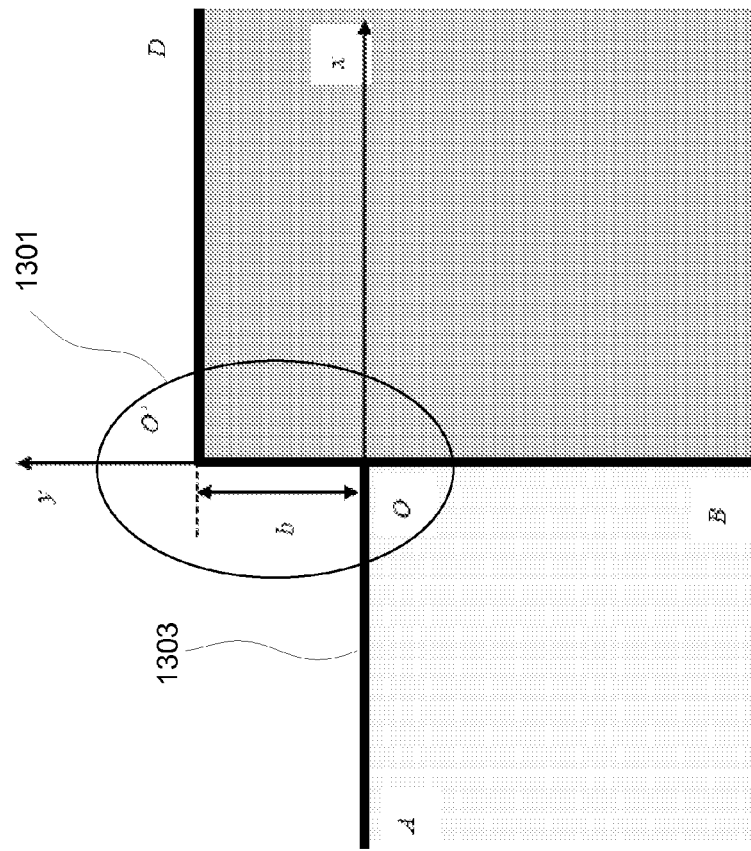
FIG. 13 illustrates a layout shape having a jog.

FIG. 13 illustrates a "straight jog" 1301 of the edge 1303. Often edges with a "jog," such as the edge 1303 are referred to as "jogging edges." As can be seen from this figure, a "jog" is created where an edge, such as the edge 1303 changes positioning in a single plane. This is common where edges have been fragmented and adjusted, such as though a resolution enhancement process. As can be seen from this figure, the corner points A, O, B, O' and D are shown. In various implementations of the invention, a the corners for a simulated jogging contour are approximated by adding ones of the corners formed by the jog. More particularly:

$$I(x, y) = \frac{1}{4}(1 - \mathrm{erf}(x))(1 - \mathrm{erf}(y))\frac{1}{4}(1 + \mathrm{erf}(x))(1 + \mathrm{erf}(b - y)) \quad (56)$$

The results of solving Equation (56) are shown in FIG. 16.

Small Jogs

Figure 14:
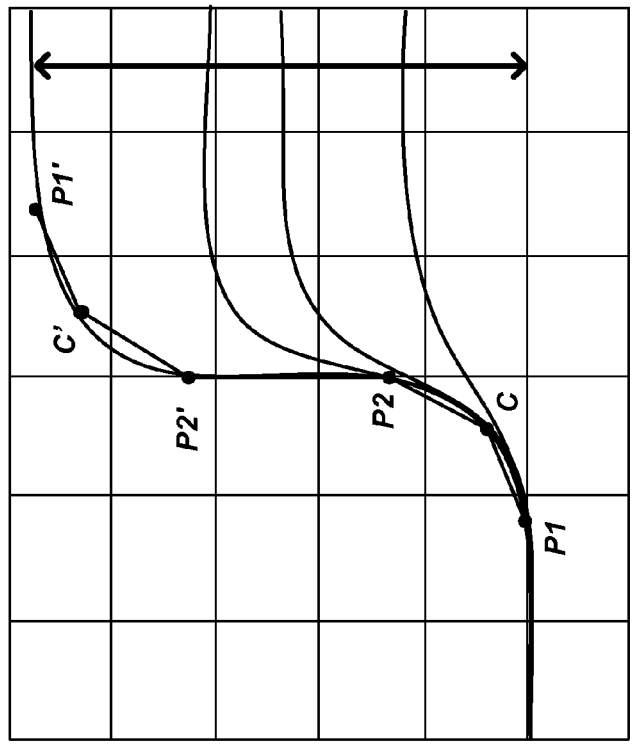
FIG. 14 illustrates simulated jogging contours.

Small jogs, which in some implementations are where $b \leq 0.4664$, may be approximated by a by straight edges as shown in FIG. 14. Positioning of the line ends P1 and P2, may be derived by first taking the derivative at the middle (i.e. $x=0$, $y=b/2$), as shown below:

$$\frac{dx}{dy} = -\frac{\partial I(x,y)/\partial x}{\partial I(x,y)/\partial y} \quad (57)$$

$$= -\frac{-(1 - \mathrm{erf}(y))e^{-x^2} + (1 + \mathrm{erf}(b-y))e^{-x^2}}{-(1 - \mathrm{erf}(x))e^{-y^2} - (1 + \mathrm{erf}(x))e^{-(b-y)^2}}$$

$$= \frac{\mathrm{erf}(y) \cdot e^{-x^2} + \mathrm{erf}(b-y)e^{-x^2}}{(1 - \mathrm{erf}(x))e^{-y^2} + (1 + \mathrm{erf}(x))e^{-(b-y)^2}}$$

Substituting $x=0$, $y=b/2$ yields:

$$\left.\frac{dy}{dx}\right|_{x=0, y=b/2} = \left.\frac{\mathrm{erf}(y)\cdot e^{-x^2} + \mathrm{erf}(b-y)e^{-x^2}}{(1-\mathrm{erf}(x))e^{-y^2} + (1+\mathrm{erf}(x))e^{-(b-y)^2}}\right|_{x=0, y=b/2} \quad (58)$$

$$= \frac{\mathrm{erf}\left(\frac{b}{2}\right) + \mathrm{erf}\left(\frac{b}{2}\right)}{e^{-\frac{b^2}{4}} + e^{-\frac{b^2}{4}}}$$

$$= e^{\frac{b^2}{4}} \mathrm{erf}\left(\frac{b}{2}\right)$$

The equation for the tangent through the middle point (i.e. $x=0$, $y=b/2$) is then:

$$y = e^{\frac{b^2}{4}} \mathrm{erf}\left(\frac{b}{2}\right) \cdot x + \frac{b}{2} \quad (59)$$

Intersecting with the coordinates $y=0$ and $y=b$ yields the coordinates for the line ends $\mathbf{P1}=(-x_p, 0)$, $\mathbf{P2}=(x_p, b)$, which may be represented by the following Equation.

$$b = e^{\frac{b^2}{4}} \mathrm{erf}\left(\frac{b}{2}\right) x_p + \frac{b}{2} \quad (60)$$

$$x_p = \frac{b \cdot e^{-\frac{b^2}{4}}}{2\mathrm{erf}\left(\frac{b}{2}\right)}$$

Which alternatively may be expressed in dimensional coordinates as follows:

$$x_p = \frac{b \cdot e^{-\left(\frac{b}{2\alpha}\right)^2}}{2\mathrm{erf}\left(\frac{b}{2\alpha}\right)} \quad (61)$$

$$x_p(b/\alpha \to 0) = \frac{\sqrt{\pi}}{2}\alpha \approx 0.8862\alpha$$

As stated above, in various implementations, a job is considered "small" the distance between the line end P1 and the apex C as shown in FIG. 14, is less than 0.05. This may be determined by deriving a solution to the following optimization problem:

$$L(x,y,\lambda) = (x+x_p)^2 + y^2 + \lambda((1-\mathrm{erf}(x))(1-\mathrm{erf}(y)) + (1+\mathrm{erf}(x))(1+\mathrm{erf}(b-y)) - 2) \to \min \quad (62)$$

Which may be simplified as:

$$\frac{\partial L}{\partial x} = \quad (63)$$

$$2x + 2x_p - \frac{2}{\sqrt{\pi}}\lambda e^{-x^2}(1 - \mathrm{erf}(y)) + \frac{2}{\sqrt{\pi}}\lambda e^{-x^2}(1 + \mathrm{erf}(b-y)) = 0$$

$$\frac{\partial L}{\partial y} = 2y - \frac{2}{\sqrt{\pi}}\lambda e^{-y^2}(1-\mathrm{erf}(x)) + \frac{2}{\sqrt{\pi}}\lambda e^{-(b-y)^2}(1+\mathrm{erf}(x)) = 0$$

$$\frac{\partial L}{\partial \lambda} = (1-\mathrm{erf}(x))(1-\mathrm{erf}(y)) + (1+\mathrm{erf}(x))(1+\mathrm{erf}(b-y)) - 2 = 0$$

Solving for $\lambda$ from the first derivative in Equation (63) yields:

$$\sqrt{\pi}\, x + \sqrt{\pi}\, x_p + \lambda e^{-x^2}(1+\mathrm{erf}(b-y)) - \lambda e^{-x^2}(1-\mathrm{erf}(y)) = 0 \quad (64)$$

$$\sqrt{\pi}\,(x+x_p) + \lambda e^{-x^2}(\mathrm{erf}(b-y) - \mathrm{erf}(y)) = 0$$

$$\lambda = -e^{x^2}\frac{\sqrt{\pi}\,(x+x_p)}{\mathrm{erf}(b-y) + \mathrm{erf}(y)}$$

Substituting into the second derivative in Equation (63) yields:

$$\lambda = -e^{x^2}\frac{\sqrt{\pi}\,(x+x_p)}{\mathrm{erf}(b-y) + \mathrm{erf}(y)}; \quad (65)$$

$$\sqrt{\pi}\, y - \lambda e^{-y^2}(1-\mathrm{erf}(x)) - \lambda e^{-(b-y)^2}(1+\mathrm{erf}(x)) =$$

$$\sqrt{\pi}\, y - \lambda\left[e^{-y^2}(1-\mathrm{erf}(x)) - e^{-(b-y)^2}(1+\mathrm{erf}(x))\right] =$$

$$\sqrt{\pi}\, y + e^{x^2}\frac{\sqrt{\pi}\,(x+x_p)}{\mathrm{erf}(b-y)+\mathrm{erf}(y)}\left[e^{-y^2}(1-\mathrm{erf}(x)) - e^{-(b-y)^2}(1+\mathrm{erf}(x))\right] = \sqrt{\pi}\, y +$$

$$\sqrt{\pi}\,(x+x_p)\frac{\left[e^{x^2-y^2}(1-\mathrm{erf}(x)) - e^{x^2-(b-y)^2}(1+\mathrm{erf}(x))\right]}{\mathrm{erf}(b-y)+\mathrm{erf}(y)} 0;$$

$$y(\mathrm{erf}(b-y) + \mathrm{erf}(y)) +$$

$$(x+x_p)\left[e^{x^2-y^2}(1-\mathrm{erf}(x)) - e^{x^2-(b-y)^2}(1+\mathrm{erf}(x))\right] = 0$$

Equation (65) yields two equations that define coordinates for the apex C, namely Equations (66) and Equation (67).

$$y(\mathrm{erf}(b-y)+\mathrm{erf}(y)) + (x+x_p)[e^{x^2-y^2}(1-\mathrm{erf}(x)) - e^{x^2-(b-y)^2}(1+\mathrm{erf}(x))] = 0 \quad (66)$$

$$(1-\mathrm{erf}(x))(1-\mathrm{erf}(y)) + (1+\mathrm{erf}(x))(1+\mathrm{erf}(b-y)) - 2 = 0 \quad (67)$$

Solving for erf (x) yields:

$$1 - \text{erf}(x) - \text{erf}(y) + \text{erf}(x) \cdot \text{erf}(y) + 1 + \\ \text{erf}(x) + \text{erf}(b-y) + \text{erf}(x) \cdot \text{erf}(b-y) - 2 = 0 \quad (68)$$

$$\text{erf}(x(\text{erf}(y) + \text{erf}(b-y))) + \text{erf}(b-y) - \text{erf}(y) = 0$$

$$\text{erf}(x) = \frac{\text{erf}(y) - \text{erf}(b-y)}{\text{erf}(y) + \text{erf}(b-y)}$$

$$x = \text{erv}^{-1}\left(\frac{\text{erf}(y) - \text{erf}(b-y)}{\text{erf}(y) + \text{erf}(b-y)}\right)$$

Substituting Equation (68) into Equation (66) yields:

$$y \cdot (\text{erf}(b-y) + \text{erf}(y)) + \\ 2\frac{(x+x_p)\left(e^{x^2-y^2}\text{erf}(b-y) + e^{x^2-(b-y)^2}\text{erf}(y)\right)}{\text{erf}(y) + \text{erf}(b-y)} = 0 \quad (69)$$

It is important to note, that Equation (69) shows a dependence of the y coordinate of the apex C (i.e. $y_C$) upon b. As a result, $y_C$ may be approximated by Equation (70) while $x_C$ may be derived from Equation (68).

$$y_c = \begin{cases} 0.3852 \cdot \text{erf}(0.202 \cdot (b+0.2)^{1.4}), & b > 0.4664 \\ 0.106 \cdot b, & 0 < b < 0.4664 \end{cases} \quad (70)$$

Large Jogs

In various implementations, jogs are considered to be large when b>0.4664. In various implementations, in the case of a large jog, the line end P1 may be derived using Equation (10). More particularly:

$$P_1 = (x_{p1}, 0)$$

$$x_{p1} = 1.163\alpha \quad (71)$$

Subsequently, the apex C may be derived by using Equation (70) and Equation (71). More particularly:

$$C = (x_c, y_c) \quad (72)$$

Finally, the line end P2 may be derived as follows:

$$P_2 = (x_{p2}, y_{p2}) \quad (73)$$

$$y_{p2} = y_c + \frac{1}{3} \cdot \left(\frac{b}{2} - y_c\right)$$

$$x_{p2} = \text{erf}^{-1}\left(\frac{\text{erf}(y_{p2}) - \text{erf}(b - y_{p2})}{\text{erf}(y_{p2}) + \text{erf}(b - y_{p2})}\right)$$

CONCLUSION

Various methods for approximating the corners of a simulated contour have been disclosed herein. In various implementations, the simulated contours are generated based in part upon a model accounting for the electron beam exposure effects of an optical lithographic process. In further implementation, a printed layout pattern is simulated based upon an intended layout pattern and a function that approximates the printing process. With some implementations, the function incorporates a Gaussian proximity kernel to approximate the electron beam exposure effects. Subsequently, one or more corners of the simulated layout may be approximated by two or more straight edges. In various implementations, the number of straight edges used to approximate the corner as well as the orientation of the one or more straight edges is determined based upon the characteristics of the corner, such as, the corner having an obtuse angle larger than 135 degrees for example. With various implementations, two straight edges are used to approximate the corner, the orientation of the two straight edges being determined by a first point, a second point, and a shared corner point.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method comprising:
   establishing, using a computing device, a target image and a simulated printed image based upon the target image, the target image having an angled corner, and the simulated printed image having a rounded corner offset from the angled corner;
   determining, using the computing device, a first line end, a second line end, and an apex of the rounded corner;
   generating, using the computing device, straight lines having endpoints corresponding to the first line end, the second line end, and the apex; and
   approximating, using the computing device, the rounded corner using the straight lines.

2. A computer-implemented method comprising:
   establishing, using a computing device, a target image and a simulated printed image based upon the target image, the target image having an angled corner, and the simulated printed image having a rounded corner offset from the angled corner;
   determining, using the computing device, a first line end, a second line end, and an apex of the rounded corner;
   generating, using the computing device, straight lines having endpoints corresponding to the first line end, the second line end, and the apex;
   approximating, using the computing device, the rounded corner using the straight lines; and
   adjusting, using the computing device, the rounded corner of the simulated printed image to represent the approximated corner.

3. The computer-implemented method recited in claim 2, wherein the rounded corner is an isolated straight corner.

4. The computer-implemented method recited in claim 2, wherein the rounded corner is a portion of a line end feature.

5. The computer-implemented method recited in claim 2, wherein the rounded corner has an acute angle.

6. The computer-implemented method recited in claim 2, wherein the rounded corner has an obtuse angle.

7. The computer-implemented method recited in claim 2, wherein the rounded corner has is a portion of a jogging edge.

8. The computer-implemented method recited in claim 1, further comprising
   determining, using the computing device, a third line end, a fourth line end, and a second apex for another rounded corner represented in the simulated printed image:
   generating, using the computing device, a second set of straight lines having endpoints corresponding to the third line end, the fourth line end, and the second apex;
   approximating, using the computing device, the another rounded corner with the second set of straight lines;

adjusting, using the computing device, the simulated printed image to represent the another rounded corner with the set of straight lines; and adjusting, using the computing device, the simulated printed image to represent the another rounded corner with the second set of straight lines.

9. One or more computer-readable devices, having computer executable instructions for calibrating a mask process model stored thereon, the computer executable instructions comprise:

causing a computer to perform a set of operations; and wherein the set of operations include:

establishing a target image and a simulated printed image based upon the target image, the target image having an angled corner, and the simulated printed image having a rounded corner offset from the angled corner;

determining a first line end, a second line end, and an apex of the rounded corner;

generating straight lines having endpoints corresponding to the first line end, the second line end, and the apex;

approximating the rounded corner using the straight lines; and adjusting the simulated printed image to represent the approximated corner.

10. The one or more computer-readable devices recited in claim 9, wherein the rounded corner is an isolated straight corner.

11. The one or more computer-readable devices recited in claim 9, wherein the rounded corner is a portion of a line end feature.

12. The one or more computer-readable devices recited in claim 9, wherein the rounded corner has an acute angle.

13. The one or more computer-readable devices recited in claim 9, wherein the rounded corner has an obtuse angle.

14. The one or more computer-readable devices recited in claim 9, wherein the rounded corner comprises a portion of a jogging edge.

15. The one or more computer-readable devices recited in claim 9, the set of operations further comprising:

determining a third line end, a fourth line end, and a second apex;

generating a second set of straight lines having endpoints corresponding to the third line end, the fourth line end, and the second apex;

approximating a second rounded corner with the second set of straight lines; and adjusting the simulated printed image to represent the approximated second rounded corner.

16. The method recited in claim 2, wherein approximating the rounded corner using the straight lines comprises:

determining, using the computing device, a length for the straight lines based in part upon the distance between a point where edges corresponding to the rounded corner would meet if the corner were not rounded; and determining, using the computing device, a pullback distance for the apex based in part upon the length and the location of the rounded corner in relation to the point.

* * * * *